United States Patent
Zhu et al.

(10) Patent No.: US 7,271,047 B1
(45) Date of Patent: Sep. 18, 2007

(54) TEST STRUCTURE AND METHOD FOR MEASURING THE RESISTANCE OF LINE-END VIAS

(75) Inventors: Jianhong Zhu, Austin, TX (US); Mark Michael, Cedar Park, TX (US); David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 11/327,641

(22) Filed: Jan. 6, 2006

(51) Int. Cl.
*H01L 21/8238* (2006.01)

(52) U.S. Cl. ............ 438/205; 257/432; 257/697; 257/758; 257/E21.526; 257/E25.013

(58) Field of Classification Search ......... 438/22–24, 438/4–18, 31, 34, 36–37, 104, 107–114, 118, 438/121–123, 128–129, 200–207; 257/432, 257/697, 758

See application file for complete search history.

(56) References Cited

U.S. PATENT DOCUMENTS

| | | | | |
|---|---|---|---|---|
| 3,691,629 | A * | 9/1972 | Schierz | 438/112 |
| 4,288,911 | A * | 9/1981 | Ports | 438/17 |
| 4,763,409 | A * | 8/1988 | Takekawa et al. | 29/827 |
| 5,679,609 | A * | 10/1997 | Aimi et al. | 438/6 |
| 6,291,254 | B1 * | 9/2001 | Chou et al. | 438/18 |
| 6,365,513 | B1 * | 4/2002 | Furukawa et al. | 438/667 |
| 6,380,556 | B1 * | 4/2002 | Bang et al. | 257/48 |
| 6,383,827 | B1 * | 5/2002 | Lukanc et al. | 438/18 |
| 7,138,294 | B2 * | 11/2006 | Nishitani et al. | 438/107 |
| 2004/0171190 | A1 * | 9/2004 | Nishitani et al. | 438/106 |
| 2006/0035404 | A1 * | 2/2006 | Saunders et al. | 438/100 |

OTHER PUBLICATIONS

Stanley Wolf and Richard N. Tauber; *Silicon Processing for the VLSI Era, vol. 2- Process Integration;* 1990; pp. 176-196.
AllAboutCircuits.com; *Kelvin (4-wire) resistance measurement-Chapter 8: DC Metering Circuits;* http://www.allaboutcircuits.com/vol_1/chpt_8/9.html; vol. I-DC; 2003; pp. 1-7.
Geoffrey K. Reeves et al.; *Electrical Modelling of Kelvin Structures for the Derivation of Low Specific Contact Resistivity;* Royal Melbourne Institute of Technology; http://www.imec.be/essderc/papers-97/7.pdf; Jul. 1997; pp. 1-4.
Krishna Saraswat; *Shallow Junctions: Contacts;* http://www.stanford.edu/class/ee311/NOTES/Ohmic_Contacts_Slides.pdf; Apr. 25, 2005; pp. 1-14.

* cited by examiner

*Primary Examiner*—Michael Lebentritt
*Assistant Examiner*—Andre' Stevenson
(74) *Attorney, Agent, or Firm*—Timothy M. Honeycutt

(57) ABSTRACT

A test structure and methods of using and making the same are provided. In one aspect, a test structure is provided that includes a first conductor that has a first end and a second conductor that has a second end positioned above the first end. A third conductor is positioned between the first end of the first conductor and the second end of the second conductor. A first electrode is coupled to the first conductor at a first distance from the third conductor and a second electrode coupled to the first conductor at a second distance from the third conductor. A third electrode is coupled to the second conductor at a third distance from the third conductor and a fourth electrode is coupled to the second conductor at a fourth distance from the third conductor. The first through fourth electrodes provide voltage sense taps and the first and second conductors provide current sense taps from which the resistance of the third conductor may be derived.

14 Claims, 4 Drawing Sheets

TEST STRUCTURE AND METHOD FOR MEASURING THE RESISTANCE OF LINE-END VIAS

BACKGROUND OF THE INVENTION

1. Field of the Invention

This invention relates generally to integrated circuits, and more particularly to test structures for measuring via resistance and to methods of making and using the same.

2. Description of the Related Art

Currently-available integrated circuits routinely contain millions of individual transistors and other electronic components. Most of the interconnections for the numerous components in such circuits are provided via one or more metallization layers that serve as global interconnect levels. In one process, each metallization layer is ordinarily deposited on the substrate of the integrated circuit as a single continuous layer that is thereafter patterned lithographically and etched to remove metal from areas where metal lines are not required. In another process, a dual damascene procedure is used.

In multi-layer metallization circuits, individual metal layers are typically separated vertically by one or more dielectric layers. Electrical contact between the adjacent metal layers is provided by openings or vias in the intermetal dielectric layer. The vias are typically formed by masking and subsequent etching of selected portions of the intermetal dielectric layer. The vias are then filled with a conductor material or sometimes combinations of conducting materials. The term "via" as used in semiconductor fabrication circles has come to mean not only the openings themselves, but also the openings filled with conducting material.

The accurate determination of via resistance is desirable from a number of standpoints. First, specific knowledge of the resistance of a via can be predictive of device performance, both in terms of switching speeds, and heat propagation. Second, via resistance provides a good indicator of the accuracy or inaccuracy of the lithography process used to fabricate the via openings. In an ideal lithography process, the via openings are patterned so that, when filled, the via will be landed fully on both the underlying metal layer and the overlying metal layer. Imperfections in any of the myriad of parameters affecting lithography, such as variations in actinic radiation intensity, photoresist composition or thickness, or stepper movement or alignment, can cause the via openings to be patterned with an offset relative to the underlying and overlying metal layers. The offset will result partially-landed vias. Partially-landed vias have higher resistances than fully-landed vias, and thus present possible restrictions on device performance and/or yield.

Conventional 4-tap (two voltage and two current) Kelvin structures have been used for some years to measure the resistance of vias. The Kelvin structure is not used on actual active device circuitry. Rather, a test structure is fabricated that is designed to mimic the electrical and lithography characteristics of a via. The test structure uses two crisscrossing, but vertically-separated metal lines and a via formed at the region where the two metal lines intersect. The via is positioned well away from the ends of the two metal lines. One voltage tap and one current tap are used for each of the two metal layers.

The conventional Kelvin structure can provide a resistance measurement for vias positioned somewhere along the long axis of a metal line, but not at the ends of the line. For vias located away from line ends, there is a sufficient of length metal line to either side of the via for reasonably accurate voltage, current and thus resistance measurements. It is desirable for the voltage taps of the Kelvin structure to be positioned far enough away from the via so that the taps themselves do not skew the electrical measurement. However, vias formed at the ends of metal lines present a difficult problem since the conventional Kelvin structure does not mimic a real line end. For line-end vias, designers have had to resort to intuition or empirical evidence as a basis for line-end via resistance determination.

The present invention is directed to overcoming or reducing the effects of one or more of the foregoing disadvantages.

SUMMARY OF THE INVENTION

In accordance with one aspect of the present invention, a test structure is provided that includes a first conductor that has a first end and a second conductor that has a second end positioned above the first end of the first conductor. A third conductor is positioned between the first end of the first conductor and the second end of the second conductor. A first electrode is coupled to the first conductor at a first distance from the third conductor and a second electrode coupled to the first conductor at a second distance from the third conductor. A third electrode is coupled to the second conductor at a third distance from the third conductor and a fourth electrode is coupled to the second conductor at a fourth distance from the third conductor. The first, second, third and fourth electrodes provide voltage sense taps and the first and second conductors provide current sense taps from which the resistance of the third conductor may be derived.

In accordance with another aspect of the present invention, an integrated circuit is provided that includes a substrate, a plurality of circuit devices on the substrate, and a test structure on the substrate. The test structure includes a first conductor that has a first end, a second conductor that has a second end positioned above the first end of the first conductor, a third conductor positioned between the first end of the first conductor and the second end of the second conductor, a first electrode coupled to the first conductor at a first distance from the third conductor and a second electrode coupled to the first conductor at a second distance from the third conductor, a third electrode coupled to the second conductor at a third distance from the third conductor and a fourth electrode coupled to the second conductor at a fourth distance from the third conductor. The first, second, third and fourth electrodes provide voltage sense taps and the first and second conductors provide current sense taps from which the resistance of the third conductor may be derived.

In accordance with another aspect of the present invention, a method of fabricating a test structure is provided. A first conductor with a first end is formed on a substrate. The first conductor has a first end. A second conductor is formed on the substrate. The second conductor has a second end positioned above the first end of the first conductor. An insulating film is formed between the first conductor and the second conductor. The insulating film has a via therein positioned between the first end of the first conductor and the second end of the second conductor. A third conductor is formed in the via and coupled to the first end of the first conductor and the second end of the second conductor. A first electrode is formed coupled to the first conductor at a first distance from the third conductor and a second electrode is formed coupled to the first conductor at a second distance from the third conductor. A third electrode is formed coupled to the second conductor at a third distance from the third conductor and a fourth electrode is formed coupled to the second conductor at a fourth distance from the third conductor. The first, second, third and fourth electrodes provide voltage sense taps and the first and second conductors provide current sense taps from which the resistance of the third conductor may be derived.

In accordance with another aspect of the present invention, a method of determining the resistance of a first conductor structure positioned in a via and having a first end and second end is provided. A second conductor is formed that has a third end positioned below and coupled to the first end of the first conductor structure. A third conductor is formed that has a fourth end positioned above the second end of the first conductor. A first electrode is formed coupled to the second conductor at a first distance from the first conductor and a second electrode is formed coupled to the second conductor at a second distance from the first conductor. A third electrode is formed coupled to the third conductor at a third distance from the first conductor and a fourth electrode is formed coupled to the third conductor at a fourth distance from the first conductor. The first distance and the third distance are substantially equal and the second and fourth distances are substantially equal to twice the first distance. A source of current and a current meter are coupled to the second and third conductors to sense the current I flowing through the first, second and third conductors, and a voltage sensing apparatus is coupled to the first, second, third and fourth electrodes to measure the voltages $V_1$, $V_2$, $V_3$ and $V_4$ at the first, second, third and fourth electrodes. The resistance R of the first conductor structure is computed according to:

$$R = \frac{2(V_1 - V_3)}{I} - \frac{(V_2 - V_4)}{I}.$$

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
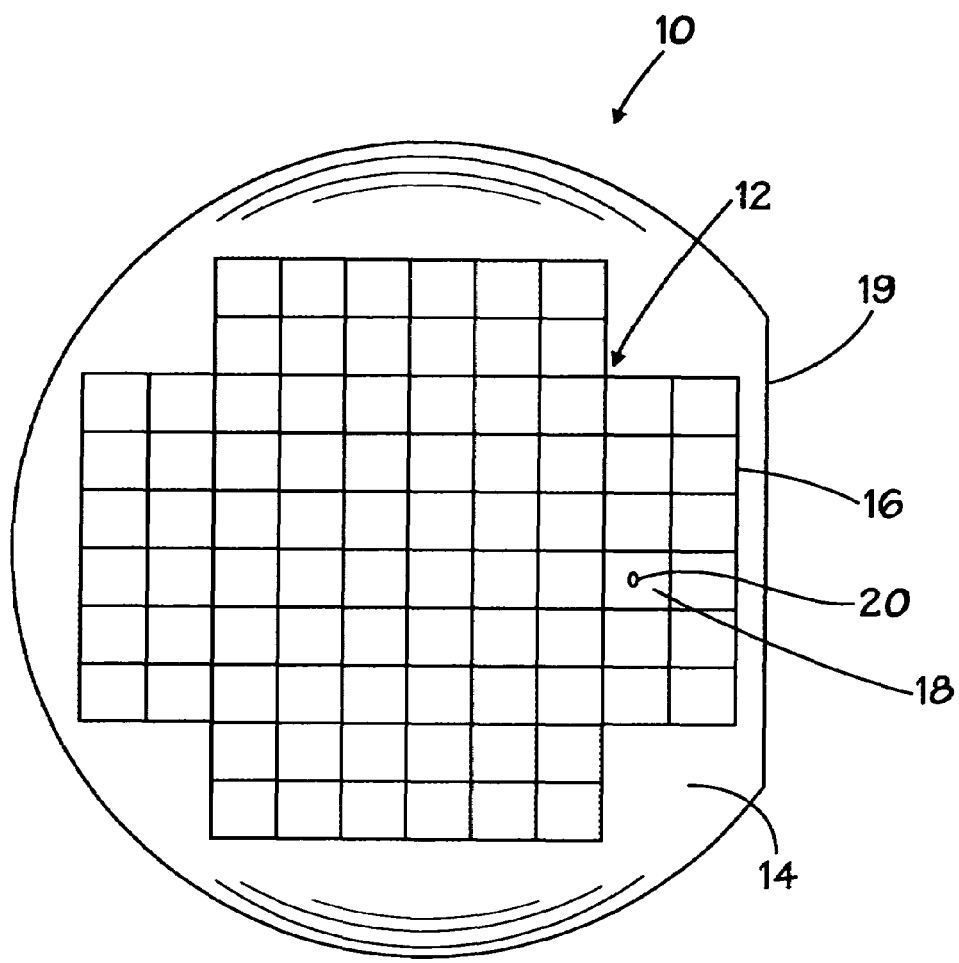
FIG. 1 is a plan view of an exemplary embodiment of a semiconductor wafer or workpiece in accordance with the present invention.

In the drawings described below, reference numerals are generally repeated where identical elements appear in more than one figure. Turning now to the drawings, and in particular to FIG. 1, therein is shown a plan view of an exemplary embodiment of a semiconductor wafer or workpiece 10. The semiconductor workpiece 10 may be composed of p-doped or n-doped silicon, germanium, or other suitable substrate materials. Semiconductor-on-insulator arrangements are envisioned as well, such as silicon-on-insulator or the like. For a variety of manufacturing reasons, it is customarily not possible to utilize the entire surface area of the workpiece 10 for active circuitry. Accordingly, and as shown in FIG. 1, the workpiece 10 includes a device region 12 and an inactive region 14. The device region 12 may consist of one or more circuit devices, such as integrated circuits. Two of the circuit devices are labeled 16 and 18 respectively. At a later stage of fabrication, the workpiece 10 may be cut up to separate individual circuit devices 16, 18 etc. The inactive region 14 consists of largely unused portions of the workpiece 10. This is not to say that the inactive region 14 may be completely devoid of circuitry. Indeed, test or other types of circuits may be formed there as necessary. There may be scribe lines between the circuit devices 16, 18 etc. The semiconductor workpiece 10 is provided with an orientation structure in the form of a flat 20. Optionally, a notch could be used.

Figure 2:
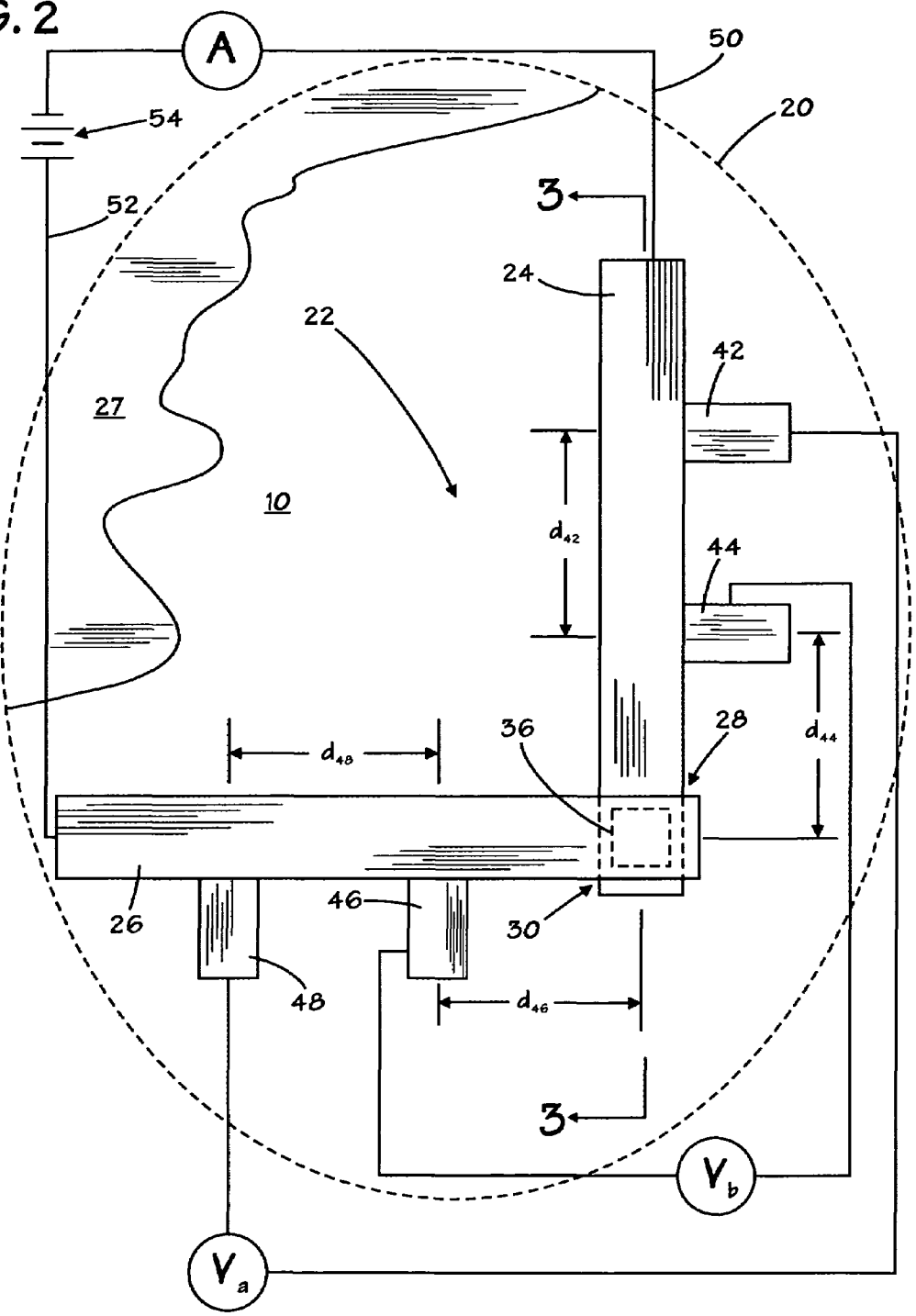
FIG. 2 is a magnified plan view of a portion of FIG. 1 depicting an exemplary embodiment of a test structure in accordance with the present invention.

A small portion 20 of the circuit device 18 is circumscribed by a small oval. That small portion 20 is depicted at a considerably higher magnification in FIG. 2. Attention is now directed to FIG. 2 and to FIG. 3 which is a sectional view of FIG. 2 taken at section 3-3. Referring initially to FIG. 2, the portion 20 includes an exemplary embodiment of a test structure 22 which is suitable for permitting the resistance of a via located at the end of a conductor line to be measured. In this regard, the test structure 22 includes conductor lines 24 and 26 positioned on the workpiece 10 and generally separated vertically by a dielectric film 27. It should be understood that the test structure 22 could be positioned in a scribe line if desired. The majority of the dielectric layer 27 is peeled away in FIG. 2 to reveal the conductor lines 24 and 26. The conductor lines 24 and 26 may be fabricated from a myriad of materials suitable for semiconductor device fabrication, such as, for example, copper, copper alloys, gold, doped polysilicon, tungsten, aluminum, aluminum alloys or the like. While particular material selected is a matter of design discretion, it may be necessary to know resistance per unit length of the material or materials selected as described in more detail below. The dielectric film 27 may be fabricated from a variety of insulating materials, such as, for example, oxide, TEOS, various glasses, polymeric materials or the like.

Figure 3:
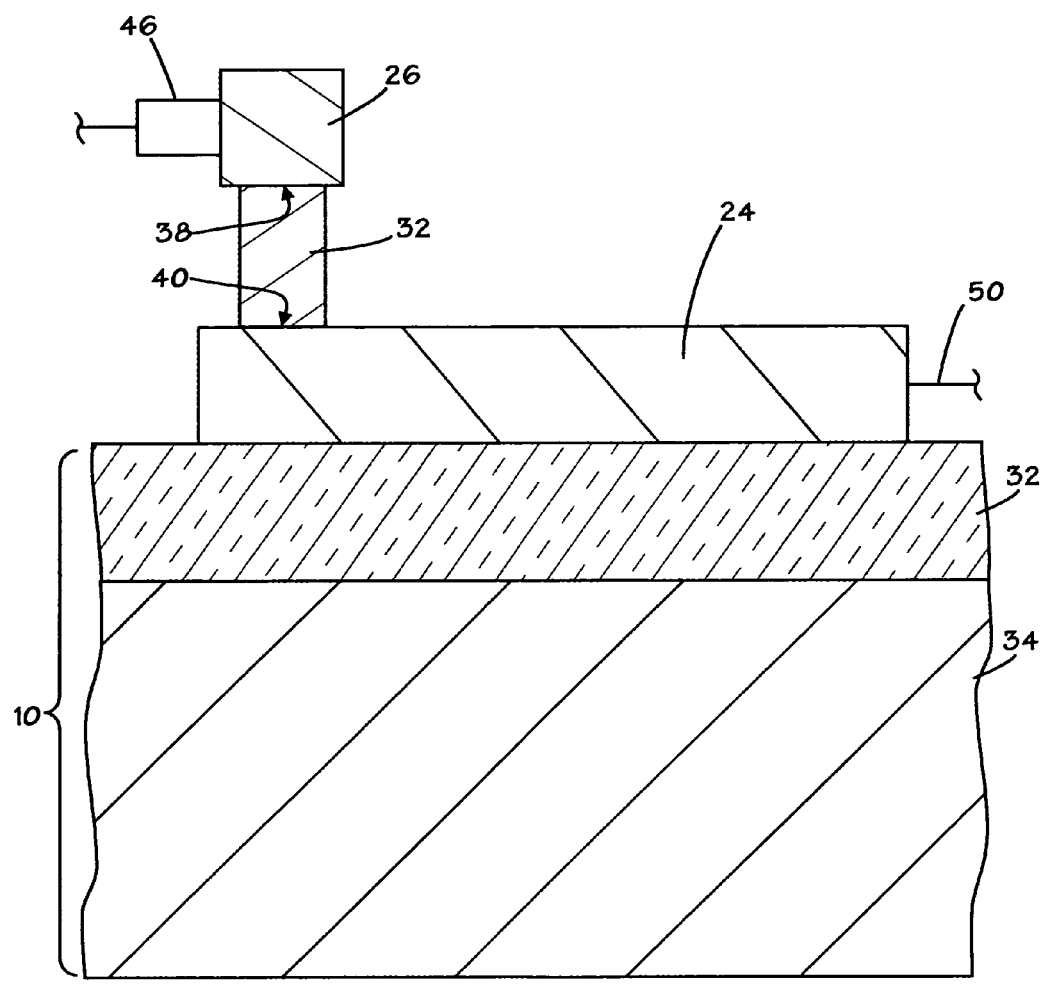
FIG. 3 is a sectional view of FIG. 2 taken at section 3-3 in accordance with the present invention.

The conductor lines 24 and 26 are fabricated so that their respective ends 28 and 30 overlap. The amount of overlap is a matter of design discretion. However, better mimicry of the fabrication and operation of a line end via structure is achieved if actual or contemplated design rules are followed to set the overlap. As best seen in FIG. 3, the conductor lines 24 and 26 are positioned at different elevations on the workpiece 10. In this example, the conductor line 24 is located below the conductor line 26. It should be noted that one or more interlayer dielectric films which would ordinarily be positioned on the workpiece 10 and surround the conductor lines 24 and 26 are peeled away and not shown for clarity of illustration. Note also that the workpiece 10 is depicted as a semiconductor-on-insulator substrate that includes a semiconductor layer 32 positioned on an insulator layer 34.

A via 36 is positioned between the ends 28 and 30 of the conductor lines 24 and 26. The via 36 is not visible and thus shown as a dashed feature in FIG. 2, but is visible in FIG. 3. The via 36 is depicted as having a rectangular cross-section but may alternatively have a variety of cross-sectional shapes. The via 36 may be fabricated from a variety of conductor materials, such as, copper, copper alloys, gold, doped polysilicon, tungsten, aluminum, aluminum alloys or the like. In the arrangement depicted in FIGS. 2 and 3, the via 36 is in substantially perfect lateral alignment with the ends 28 and 30 of the conductor lines 24 and 26 such that the top 38 of the via 36 is fully landed with the conductor line 26 and the bottom 40 of the via 32 is fully landed on the conductor line 24. This, of course, is an ideal result of a line-end via fabrication process. However, in actual practice there is often misalignment and thus only partially landing of the via 36. The test structure 22 is designed to detect these anomalies.

Two electrodes or taps 42 and 44 are coupled to the conductor line 24 and positioned such that the tap 44 is a distance $d_{44}$ from the via 36 and the tap 42 is a distance $d_{42}$ from the tap 44. Two taps 46 and 48 are coupled to the conductor line 26 and positioned such that the tap 46 is a distance $d_{46}$ from the via 36 and the tap 48 is a distance $d_{48}$ from the tap 46.

The taps 42, 44, 46 and 48 serve as voltage taps so that respective voltages $V_{42}$, $V_{44}$, $V_{46}$ and $V_{48}$, and thus voltage drops $V_{48}-V_{42}$ and $V_{46}-V_{44}$ may be sensed. To this end, a voltage sensing apparatus is used. In this exemplary embodiment, the voltage sensing apparatus includes a voltage meter $V_a$ connected to the taps 48 and 42 and a voltage meter $V_b$ connected to the taps 46 and 44. The voltage meters $V_a$ and $V_b$ may be on-chip devices or external instruments and may even be part of the same instrument with multiple electrode capabilities. The remote ends of the conductor lines 24 and 26 are coupled to respective current taps 50 and 52. A source 54 and a current sensing apparatus or meter A are connected between the current taps 50 and 52. The source 54 may be a battery or other source of current. The current meter A may be on or off-chip as desired.

With the voltage drops $V_{48}-V_{42}$ and $V_{46}-V_{44}$ provided by the voltage meters $V_a$ and $V_b$ and the current I provided by the current meter A, Ohm's Law may be used to calculate the resistance $R_{36}$ of the via 36. Turning first to the voltage drop $V_{48}-V_{42}$:

$$V_{48}-V_{42}=I(rd_{48}+rd_{46}+rd_{44}+rd_{42}+R_{36}) \quad \text{Equation 1}$$

where r is the resistance per unit length of the conductor lines 24 and 26 and $R_{36}$ is the resistance of the via 36. Equation 1 may be solved for the via resistance $R_{36}$ as follows:

$$\frac{V_{48}-V_{42}}{I} - r(d_{48}+d_{46}+d_{44}+d_{42}) = R_{36} \quad \text{Equation 2}$$

The voltage drop $V_{46}-V_{44}$ yields:

$$V_{46}-V_{44}=I(rd_{46}+rd_{44}+R_{36}) \quad \text{Equation 3}$$

Equation 3 may be solved for the via resistance $R_{36}$ as follows:

$$\frac{V_{46}-V_{44}}{I} - r(d_{46}+d_{44}) = R_{36} \quad \text{Equation 4}$$

Either Equation 2 or Equation 4 may be used to determine the via resistance $R_{36}$ and one may be used to check the result of the other.

An arithmetic simplicity may be obtained if the test structure 10 is laid out and fabricated so that the distances $d_{42}$, $d_{44}$, $d_{46}$ and $d_{48}$ are substantially equal to, say, a distance d. Stated otherwise, the distance $d_{46}$ would be substantially equal to $d_{44}$ and the distances $d_{42}$ and $d_{48}$ would be substantially equal to twice $d_{44}$ or $d_{46}$. In this circumstance, Equation 1 simplifies to:

$$V_{48}-V_{42}=I(r4d+R_{36}) \quad \text{Equation 5}$$

and Equation 3 simplifies to:

$$V_{46}-V_{44}=I(r2d+R_{36}) \quad \text{Equation 6}$$

Equations 5 and 6 can be combined and solved for $R_{36}$ to yield:

$$R_{36} = \frac{2(V_{46}-V_{44})}{I} - \frac{(V_{48}-V_{42})}{I} \quad \text{Equation 7}$$

Of course, Equation 7 has the added refinement that the resistance per unit length term r drops out. This is useful if the resistance per unit length of the conductor lines 24 and 26 is hard to determine or fluctuates along the length of a given line. The skilled artisan will appreciate that fabricating circuit structures in integrated circuits with precise dimensions on a consistent basis is extremely difficult. Accordingly, the term "substantially" is used herein in the context of the selected distances to denote that geometric perfection is not required. In circumstances where the resistance per unit length of one conductor, say conductor 24, is different from the resistance per unit length of the other conductor 26, the foregoing equations may be modified to include therein multiple resistance per unit length terms, such as $r_{24}$ and $r_{26}$.

Figure 4:
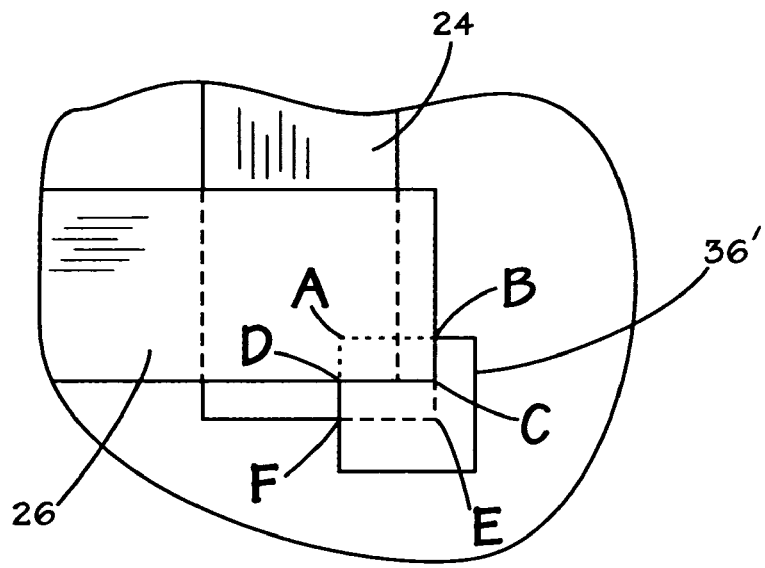
FIG. 4 is a plan view of one example of a possible via misalignment that may be sensed with the test structure of the present invention.
Figure 5:
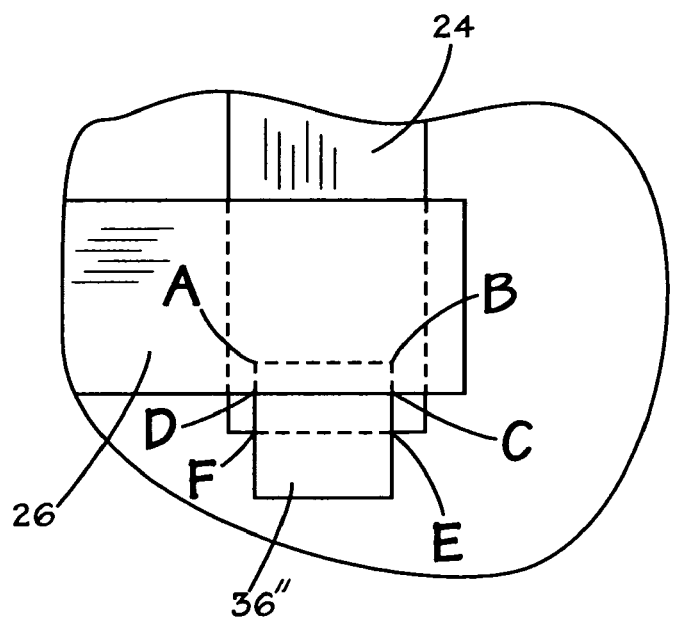
FIG. 5 is a plan view of another example of a possible via misalignment that may be sensed with the test structure of the present invention.

As noted above, the arrangement depicted in FIGS. 2 and 3 represents a fully-landed via 36 and thus an optimum result from layout, masking and patterning lithography standpoints. However, mis-alignment during fabrication may produce partially-landed vias. FIGS. 4 and 5 depict two possible types of via mis-alignment. In FIG. 4, the via 36' is offset obliquely away from both the conductor lines 24 and 26 such that the via 36' is landed with the conductor line 24 by the area represented by the rectangle ABEF and landed with the conductor 26 by the area represented by the rectangle ABCD. In the example shown in FIG. 5, the via 36" is mis-aligned primarily in one direction. The via 36" is landed with the conductor line 24 by the area again represented by the rectangle ABEF and landed with the conductor 26 by the area represented again by the rectangle ABCD. Qualitatively speaking, the via 36" has larger landing areas and thus probably exhibits lower resistance. The less than desired landing areas depicted in FIGS. 4 and 5 may or may not produce excessive resistance for the vias 36' and 36" depending on the integrated circuit in question and the design rules in place. However, the test structure in accordance with the present invention enables the designer to determine the via resistance and as a result be in a better position to make judgments about the risks if any represented by less than perfect via alignment. The vias 36' and 36" are represented as rectangular shapes in FIGS. 4 and 5. However, in actual fabrication, the vias 36' and 36" may take on a more circular shape.

Referring again to FIG. 2, the test structure 22 may be fabricated using well-known techniques for conductor layer, dielectric layer and via fabrication. For example, the conductor lines 24 and 26 and taps 42, 44, 46 and 48 may be fabricated by forming conductor films that are subjected to appropriate masking and etch or ablative patterning techniques. The dielectric layer 27 may be formed by chemical vapor deposition with or without plasma enhancement or other techniques for dielectric formation. The via opening may be formed by etch or ablative techniques. Planarization, if necessary, of the components may be by etch-back planarization, chemical-mechanical-polishing or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a test structure, comprising:
    forming a first conductor on a substrate, the first conductor having a first end;
    forming a second conductor on the substrate, the second conductor having a second end positioned above the first end of the first conductor;
    forming an insulating film between the first conductor and the second conductor, the insulating film having a via therein positioned between the first end of the first conductor and the second end of the second conductor;
    forming a third conductor positioned in the via and coupled to the first end of the first conductor and the second end of the second conductor;
    forming a first electrode coupled to the first conductor at a first distance from the third conductor and a second electrode coupled to the first conductor at a second distance from the third conductor;
    forming a third electrode coupled to the second conductor at a third distance from the third conductor and a fourth electrode coupled to the second conductor at a fourth distance from the third conductor; and
    wherein the first, second, third and fourth electrodes provide voltage sense taps and the first and second conductors provide current sense taps from which the resistance of the third conductor may be derived.

2. The method of claim 1, comprising coupling a source of current to the first and second conductors and a voltage sensing apparatus to the first, second, third and fourth electrodes.

3. The method of claim 1, wherein the first conductor is formed substantially orthogonally to the second conductor.

4. The method of claim 1, wherein the first distance is substantially equal to the third distance and the second distance and the fourth distance are each substantially equal to twice the first distance.

5. The method of claim 1, wherein the first and second conductors and the third conductor are composed of metallic materials.

6. The method of claim 5, wherein the metallic materials comprise copper, copper alloys, gold, tungsten, aluminum, or aluminum alloys.

7. The method of claim 1, wherein the substrate comprises at least one integrated circuit.

8. A method of fabricating a test structure, comprising:
    forming a first conductor on a semiconductor-on-insulator substrate, the first conductor having a first end;
    forming a second conductor on the semiconductor-on-insulator substrate, the second conductor having a second end positioned above the first end of the first conductor;
    forming an insulating film between the first conductor and the second conductor, the insulating film having a via therein positioned between the first end of the first conductor and the second end of the second conductor;
    forming a third conductor positioned in the via and coupled to the first end of the first conductor and the second end of the second conductor;
    forming a first electrode coupled to the first conductor at a first distance from the third conductor and a second electrode coupled to the first conductor at a second distance from the third conductor;
    forming a third electrode coupled to the second conductor at a third distance from the third conductor and a fourth electrode coupled to the second conductor at a fourth distance from the third conductor; and
    wherein the first, second, third and fourth electrodes provide voltage sense taps and the first and second conductors provide current sense taps from which the resistance of the third conductor may be derived.

9. The method of claim 8, comprising coupling a source of current to the first and second conductors and a voltage sensing apparatus to the first, second, third and fourth electrodes.

10. The method of claim 8, wherein the first conductor is formed substantially orthogonally to the second conductor.

11. The method of claim 8, wherein the first distance is substantially equal to the third distance and the second distance and the fourth distance are each substantially equal to twice the first distance.

12. The method of claim 8, wherein the first and second conductors and the third conductor are composed of metallic materials.

13. The method of claim 12, wherein the metallic materials comprise copper, copper alloys, gold, tungsten, aluminum, or aluminum alloys.

14. The method of claim 8, wherein the semiconductor-on-insulator substrate comprises at least one integrated circuit.

* * * * *